United States Patent
Bajkowski et al.

(10) Patent No.: US 9,502,119 B2
(45) Date of Patent: Nov. 22, 2016

(54) DISTRIBUTED CAPACITIVE DELAY TRACKING BOOST-ASSIST CIRCUIT

(71) Applicants: Maciej Bajkowski, Austin, TX (US); Jan-Michael Huber, Cedar Park, TX (US); Ravi Venkatesa, Austin, TX (US)

(72) Inventors: Maciej Bajkowski, Austin, TX (US); Jan-Michael Huber, Cedar Park, TX (US); Ravi Venkatesa, Austin, TX (US)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 14/813,103

(22) Filed: Jul. 29, 2015

(65) Prior Publication Data
US 2016/0148659 A1 May 26, 2016

Related U.S. Application Data

(60) Provisional application No. 62/082,611, filed on Nov. 20, 2014.

(51) Int. Cl.
| | |
|---|---|
| G11C 16/08 | (2006.01) |
| G11C 7/12 | (2006.01) |
| G11C 5/14 | (2006.01) |
| G11C 8/08 | (2006.01) |
| G11C 5/04 | (2006.01) |

(52) U.S. Cl.
CPC .................. *G11C 16/08* (2013.01); *G11C 5/04* (2013.01); *G11C 5/145* (2013.01); *G11C 7/12* (2013.01); *G11C 8/08* (2013.01)

(58) Field of Classification Search
CPC ......... G11C 16/08; G11C 5/145; G11C 7/12; G11C 8/08
See application file for complete search history.

(56) References Cited

U.S. PATENT DOCUMENTS

| | | | | |
|---|---|---|---|---|
| 4,506,350 | A | * | 3/1985 | Asano ................. G11C 16/08 365/185.21 |
| 2008/0068901 | A1 | * | 3/2008 | Ehrenreich ............ G11C 5/145 365/189.11 |
| 2012/0147654 | A1 | * | 6/2012 | Qidwai ................. G11C 11/22 365/145 |
| 2013/0064006 | A1 | * | 3/2013 | Garg ....................... G11C 8/08 365/154 |

\* cited by examiner

*Primary Examiner* — J. H. Hur
*Assistant Examiner* — Ajay Ojha
(74) *Attorney, Agent, or Firm* — Renaissance IP Law Group LLP

(57) ABSTRACT

According to one general aspect, an apparatus may include a plurality of voltage boosted circuits. Each voltage boosted circuit may include a power gater configured to select between an array supply voltage and a second voltage, wherein the second supply voltage is greater than the array supply voltage. Each voltage boosted circuit may include may also include a distributed boost capacitor configured to generate, in part, the second supply voltage. Each distributed boost capacitor may be physically located throughout a boosting network. Each voltage boosted circuit may further include a driver configured to generate an electrical signal based upon, as selected by the power-gater, either the array supply voltage or the second supply voltage.

20 Claims, 5 Drawing Sheets

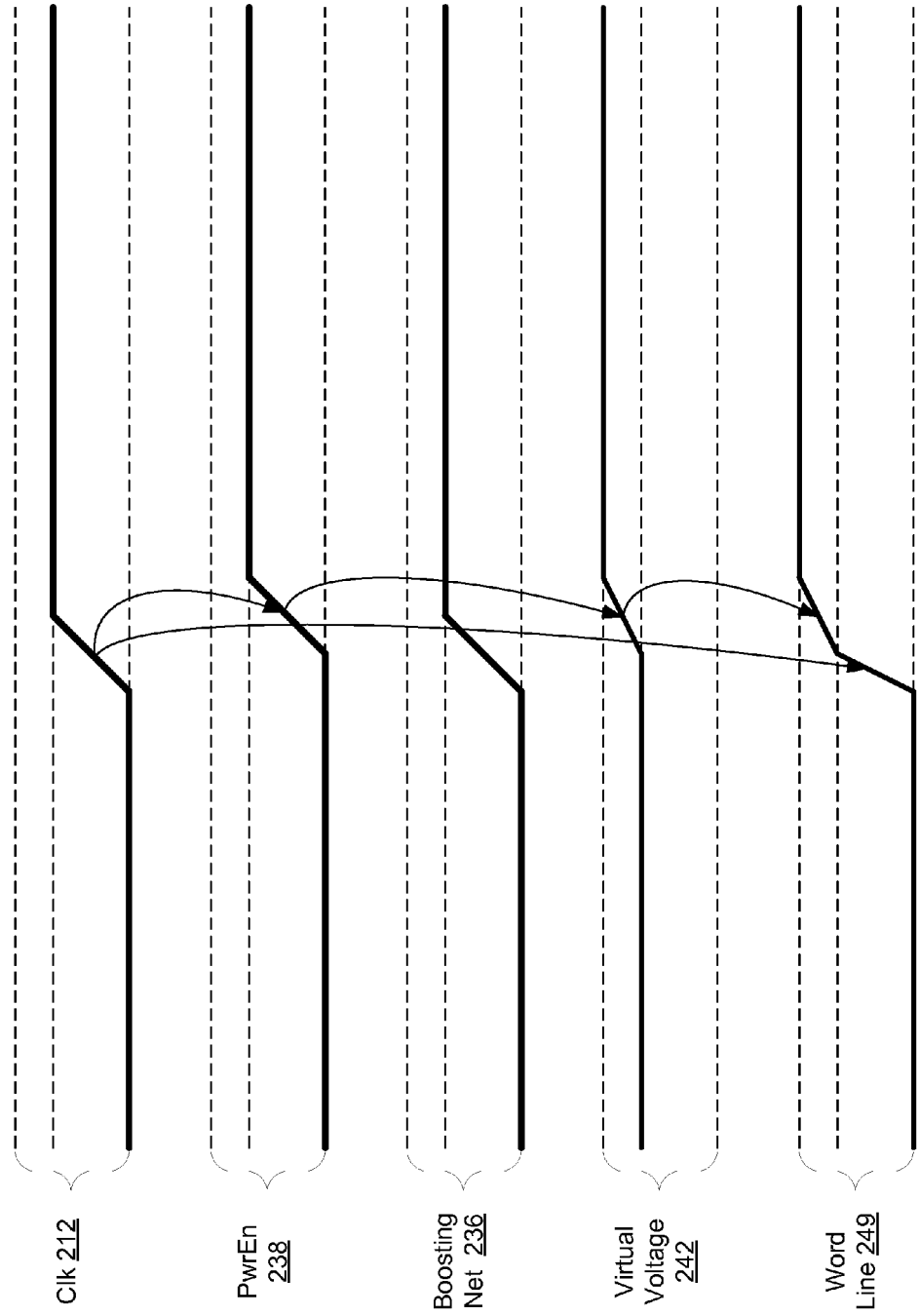

DISTRIBUTED CAPACITIVE DELAY TRACKING BOOST-ASSIST CIRCUIT

CROSS-REFERENCE TO RELATED APPLICATION

This application claims priority under 35 U.S.C. §119 to Provisional Patent Application Ser. No. 62/082,611, entitled "DISTRIBUTED CAPACITIVE DELAY TRACKING BOOST-ASSIST CIRCUIT" filed on Nov. 20, 2014. The subject matter of this earlier filed application is hereby incorporated by reference.

TECHNICAL FIELD

This description relates to voltage control, and more specifically, to boosting a power supply voltage.

BACKGROUND

A boost converter, boosting circuit, or step-up converter is generally a direct current (DC)-to-DC power converter that includes an output voltage greater than its input voltage. Often a boosting circuit is a class of switched-mode power supply (SMPS) that includes at least two semiconductors (a diode and a transistor) and at least one energy storage element, a capacitor, inductor, or the two in combination. Filters made of capacitors (sometimes in combination with inductors) are normally added to the output of the converter to reduce output voltage ripple.

Boost circuits are often used for low-voltage operations where performance advantages can be obtained by temporarily boosting the voltage of a specific circuit above that of the normal power supply. These types of boosting circuits are particularly useful in memory arrays. For example during read operations, boosting the read word-line above the available supply voltage may result in improved clock to output times. In another example involving write operations, boosting the voltage of the write word-line above the available supply voltage may results in a better write-ability of the bit-cell. By temporarily boosting the voltage of the memory circuit (or at least the word-line thereof), the memory circuit can operate during normal operation at a reduced or lowered voltage.

SUMMARY

According to one general aspect, an apparatus may include a plurality of voltage boosted circuits. Each voltage boosted circuit may include a power gater configured to select between an array supply voltage and a second voltage, wherein the second supply voltage is greater than the array supply voltage. Each voltage boosted circuit may also include a distributed boost capacitor configured to generate, in part, the second supply voltage. Each distributed boost capacitor may be physically located throughout a boosting network. Each voltage boosted circuit may further include a driver configured to generate an electrical signal based upon, as selected by the power-gater, either the array supply voltage or the second supply voltage.

According to another general aspect, a system may include a plurality of memory cells, each memory cell accessed by a respective word line. The system may include a plurality of word line drivers. Each word line driver may be configured to generate a word line signal at either a first voltage or a second voltage, wherein the second voltage is higher than the first voltage. The system may further include a distributed boost network configured to generate, in part, the second voltage from the first voltage, wherein the distributed boost network is physically distributed amongst the plurality of word line drivers.

According to another general aspect, an apparatus may include a plurality of memory cells configured to store data. The apparatus may include a plurality of memory cell access drivers, each memory cell access driver may be configured to generate an access signal at either a first voltage or a second voltage, wherein the second voltage is higher than the first voltage. The apparatus may include a boosting means for boosting the first voltage to the second voltage, wherein the boosting means is physically distributed amongst the plurality of memory cell access drivers.

The details of one or more implementations are set forth in the accompanying drawings and the description below. Other features will be apparent from the description and drawings, and from the claims.

A system and/or method for voltage control, and more specifically, to boosting a power supply voltage, substantially as shown in and/or described in connection with at least one of the figures, as set forth more completely in the claims.

BRIEF DESCRIPTION OF THE DRAWINGS

FIG. 2 is a timing diagram of an example embodiment of a system in accordance with the disclosed subject matter.

Like reference symbols in the various drawings indicate like elements.

DETAILED DESCRIPTION

Figure 1:
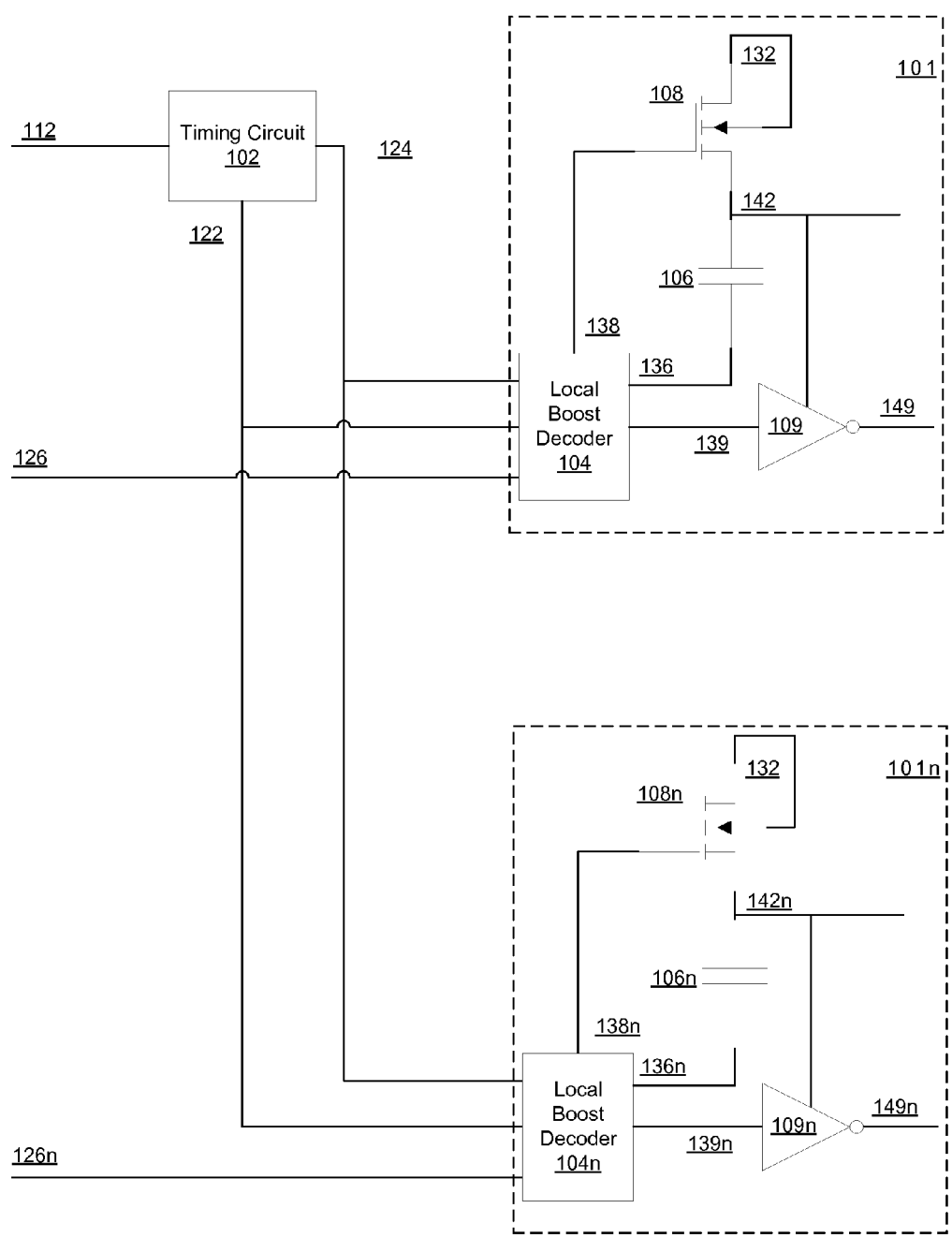
FIG. 1 is a circuit diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a circuit diagram of an example embodiment of a system 100 in accordance with the disclosed subject matter. In the illustrated embodiment, a voltage boosting circuit 101 may be employed to select between two voltages (e.g., an array voltage or supply, and a boosted voltage or supply, etc.). In the illustrated embodiment, the voltage boosting circuit 101 may be distributed throughout a memory array (for example), or more generally a circuit.

In various embodiments, the system 100 may include a timing circuit 102, and a plurality of voltage boosting circuits (e.g., circuits 101 and 101n, etc.). In such an embodiment, each voltage boosting circuit 101 may be configured to select between one of two voltages, a first, lower, normal voltage, or a second, higher, temporary voltage. In the illustrated embodiment, the voltage boosting circuit 101 may be configured such that one can enable (select the higher voltage) or disable (select the lower voltage) each voltage boosting circuit 101 individually, as opposed to all of them. In some embodiments, the system 100 may be arranged such that the plurality of voltage boosting circuits 101 may be grouped into sub-portions that may be enabled or disabled as a group. It is understood that the above are merely a few illustrative examples to which the disclosed subject matter is not limited.

In the illustrated embodiment, a clock signal 112 may be input into the timing circuit 102. In various embodiments, the timing circuit 102 may be configured to output the specialized version of the clock signal for the voltage boosting circuit 101. In this context, that signal will be referred to as word-line clock signal 122; although, it is understood that the above is merely one illustrative example to which the disclosed subject matter is not limited. Further, the timing circuit 102 may be configured to output a boosting net or boosting network control signal 124. In various embodiments, the boosting net signal 124 may be configured to control, at least in part, when the output voltage switches from the first voltage to the second voltage.

In various embodiments, each voltage boosting circuit 101 may include a driver 109 or 109n, a switch 108 or 108n, and a boosting element 106 or 106n, respectively. In such an embodiment, the driver 109 may be configured to generate the output signal 149 (e.g., a word-line signal, etc.) at either a first voltage or a higher second voltage. In one such embodiment, the switch 108 may be configured to select between the two voltages. And, the boosting element 106 may be configured to provide an additional voltage or charge that is substantially the difference between the first voltage and the second voltage. In such an embodiment, when the second voltage is selected, the additional voltage or charge may be added (or subtracted) to the first voltage and the result may be the second voltage.

In the illustrated embodiment, the switch 108 may include a transistor (e.g., an NMOS enhancement transistor, a PMOS enhancement transistor, etc.), and the boosting element 106 may include a capacitor. It is understood that the above are merely a few illustrative examples to which the disclosed subject matter is not limited. For example, the boosting element 106 may include an inductor, a combination of capacitor and inductor, etc.

Before the distributed nature of the disclosed subject matter is discussed, a brief explanation of the boosting function of the voltage boosting circuit 101 will be described. When the switch 108 is closed or enabled, the voltage applied to the driver 109 (represented by the virtual voltage at point 142) may be equal to the first, lower voltage 132. In the illustrated embodiment, the first voltage may be referred to as the array voltage. In such an embodiment, the output signal 149 is driven at the first, lower voltage 132. Also, during this time, energy (e.g., current, voltage, charge, etc.) may be stored in the boosting element 106.

In one embodiment, when the switch 108 is opened or disabled, the path between the first voltage 132 and the point 142 may be severed. In such an embodiment, a boost voltage may be applied to the signal 136. In various embodiments, this boost voltage may be equal to the first voltage. As the boosting element 106 is in series with the boost voltage (represented by signal 136), the voltage or charge of the boost voltage and the voltage stored in the boost element 106 may be added to form the higher second voltage. As the boosting element 108 is between the signal 136 and the point 142, the point 142 may be set to the second voltage. The driver 109 may then drive the output signal 149 at the second, higher voltage.

In the illustrated embodiment, the switch or transistor 108 may have the source and body pins both coupled with the first or array voltage 132. The gate pin may be coupled with an enable signal 138 and 138n, respectively. And, the drain pin may be coupled to the point 142 and 142n, respectively. In some embodiments, the transistor 108 may be referred to as a power-gater.

As can be seen, in such an embodiment, the timing of the enable signal 108 and the boost signal 136 may be important, as the switch 108 would ideally be closed as the boosting signal 136 begins to provide the first voltage in series with the additional voltage provided by the boosting element 106 (ultimately resulting in the second voltage).

In various embodiments, each voltage boosting circuit 101 may include a local boosting decoder circuit 104 or 104n, respectively. In such an embodiment, the local boosting decoder circuit 104 may be configured to coordinate the timing of the enablement signal 138 and the boosting signal 136. Further, the local boosting decoder circuit 104 may be configured to generate the un-boosted local control signal or, in the illustrated embodiment, a word-line bar signal 139. In this example, as the driver 109 includes an inverter, the un-boosted local control signal 139 may be an inverse or opposite version of the final boosted control signal 149 (e.g., the word-line 149). It is understood that the above is merely one illustrative example to which the disclosed subject matter is not limited.

As described above, in the illustrated embodiment, the system 100 may be configured to select between the two voltages on an individual voltage boosting circuit 101 basis. In various embodiments, the local boost decoder 104 may be configured to receive the boosting net signal 124 and the word-line clock signal 122. In addition, the local boost decoder 104 may receive a local enable signal 126 or 126n, respectively, that indicates to the local boost decoder 104 or 104n, that that voltage boosting circuit 101 is to select the second voltage (as opposed to the first voltage). In response to these three signals 122, 124, and 126, the local boost decoder 104 may be configured to generate the enablement signal 138 and the boosting signal 136 (or not if the local enable signal 126 so indicates).

Traditionally, the boosting element 106 (and often the switch 108) was lumped together in a central location. In such an embodiment, a relatively large version of the boosting element 106 was employed to provide extra voltage to all drivers 109 and 109n in the system. In addition to the large area requirement of having a relatively large boosting element in a single location, this resulted in the system having to use either the first or second voltage for all drivers 109 in the system. Also, the timing of the various signals became difficult. As it takes time for a signal to travel from an origin to a destination, the drivers 109 closer to the lumped boosting element experienced the start of the second voltage sooner than those drivers located far away. Conversely, the nearer drivers returned to the first voltage sooner than the further away drivers.

In the illustrated embodiment, a plurality of distributed boosting elements 106, may be placed along the critical delay path of the output signal 149. In such an embodiment, the boosting signal 136 may be more properly aligned with the input signal 139, and the time delay incurred from the centralized lump boosting element to the driver may be eliminated or at least normalized. In such an embodiment, the alignment may result in each driver experiencing an equal boost duration.

Further, in the illustrated embodiment, the word-line clock 122 and the boosting net signal 124 may be routed in such a way that they incur substantially the same delay, from the perspective of each of the plurality of voltage boosting circuit 101. In such an embodiment, while the word-line clock 122 and the boosting net signal 124 may arrive more quickly at the voltage boosting circuit 101, as compared to the voltage boosting circuit 101n, both signals arrive at the voltage boosting circuit 101 at the same time (as opposed to in an un-aligned manner). In such an embodiment, this alignment of the clock signal 122 and the boosting net signal 124 may result in word-line delay tracking and reduce or eliminate the timing issues incurred in a lumped boosting element system.

In various embodiments, the distributed boosting elements 106 may be sufficiently small to be placed in vacant or unused spaces in the system 100. This is illustrated is more detail in reference to FIG. 3b.

Likewise, in the illustrated embodiment, the system 100 may include distributed switches 108 and 108n. In a traditional system the switch or power-gater may have also been lumped or centralized in a single place. This may have caused an all-or-nothing form of enablement in which all drivers where slaved to either the first voltage or the second voltage. Further, current leakage in the lumped switch system would have been increased. This increased leakage often resulted in a shorter boost duration time, in which the second voltage would have been selected or applied to the drivers.

In the illustrated embodiment, the distributed switches 108 and 108n may be configured to allow an individual granularity level of control of the voltage selection process. Further, as the distributed switches 108 are smaller than the lumped alternative, the current leakage may be reduced; therefore, the boost or second voltage time may be increased. In some embodiments, the switch 108 may be sufficiently small to allow them to be placed in vacant or unused spaces in the system 100. This is illustrated is more detail in reference to FIG. 3b.

FIG. 2 is a timing diagram 200 of an example embodiment of a system in accordance with the disclosed subject matter. In various embodiments, the timing diagram 200 may have been produced by a distributed boosting element system such as that of FIG. 1. It is understood that the above is merely one illustrative example to which the disclosed subject matter is not limited.

In various embodiments, the clock 212 may, at some point, transition from a ground voltage (illustrated by the lowest dashed line) to the first voltage (illustrated by the middle dashed line). In the illustrated embodiment, the system may desire that the driver make use of the second or higher voltage.

In some embodiments, a power-gater enable signal 238 may transition to the first voltage also. This power-gater enable signal 238 may cause a switch element (e.g., the transistor 108 of FIG. 1, or a PMOS variant thereof, etc.) to open or decouple the voltage applied to the driver (via the virtual voltage 242; e.g., at point 142 of FIG. 1) from the first voltage as supplied through the switch.

In the illustrated embodiment, the boosting net signal 236 may be coupled in series with the boosting element (e.g., the capacitor, etc.). In some embodiments, the boosting net signal 236 may be the same as the boost signal, but unimpeded or delayed by a local boost decoder; it is understood that the above is merely one illustrative example to which the disclosed subject matter is not limited.

As the boosting net signal 236 is aligned with the clock signal 212, it may transition from the ground voltage to the first voltage at substantially the same time the clock does. In such an embodiment, this may mean that as the power-gater enable signal 238 (which is slightly delayed from the clock signal 212) decouples the virtual voltage 242 from the switch supplied first voltage, the boosting net 236 is there to continue supplying the first voltage.

However, in the illustrated embodiment, as the boosting element (e.g., capacitor, etc.) is in series with the boosting net signal 236 and itself supplying an additional voltage, the virtual voltage 242 applied to the driver transitions from the first voltage (illustrated by the middle dashed line) to the higher second voltage (illustrated by the higher dashed line).

In the illustrated embodiment, the driver generates the word-line 249. In such an embodiment, as the clock 212 causes the driver to generate the word-line 249, initially it is driven or generated at the first voltage. But, as the higher virtual voltage propagates through the circuit, the word-line 249 is quickly driven at the second, higher voltage.

In the illustrated embodiment, because the clock 212 and boosting net 236 signals are substantially aligned, the transition from the first voltage to the second voltage is substantially seamless. In such an embodiment, the duration of the boosted or second voltage portion of the word-line signal 249 may be maximized or increased.

Figure 3A:
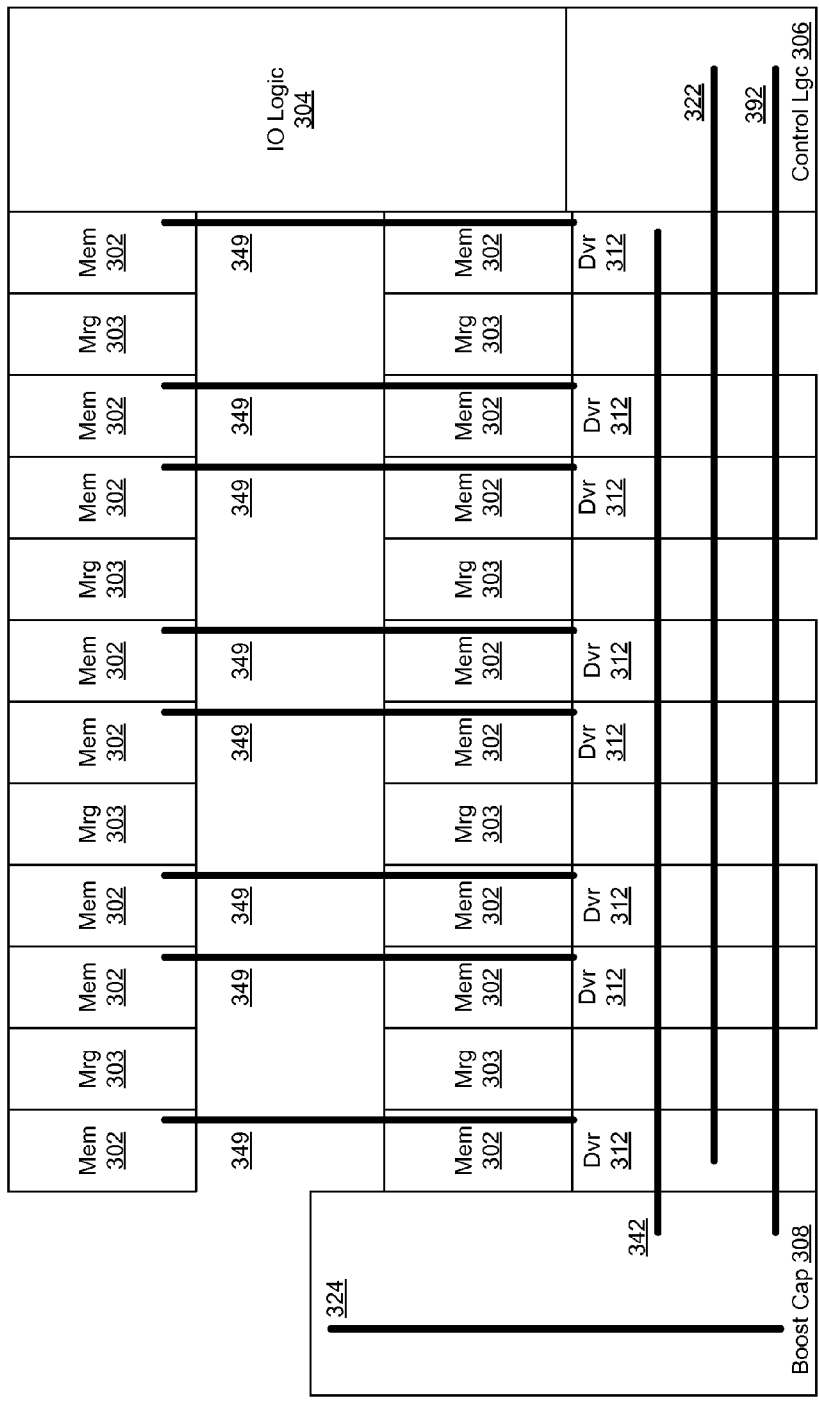
FIG. 3a is a block diagram of an example embodiment of a system in accordance with the prior art.

FIG. 3a is a block diagram of an example embodiment of a system 301 in accordance with the prior art. This system 301 is shown to illustrate some differences between a lumped boosting element system (e.g., the system 301) and a distributed boosting element system (e.g., system 300 of FIG. 3b).

In various embodiments, the system 301 may include a memory array. The memory array may include a plurality of memory cells 302 arranged in words. In the illustrated embodiment, only a few bits of each word are shown. These words of memory cells 302 may be separated by merge logic 303.

When an input/output (I/O) request (e.g., a read request, write request, etc.) is received by the system 301, the IO logic 304 may detect the appropriate word line for the request. The control logic 306 may then control the signals used to activate the proper word-line driver 312, and word-line signal 349. Via the activation of the appropriate word-line signal 349, the desired or target word of the memory access may be accessed.

In the illustrated embodiment, a lumped boost capacitor 308 may be included in the system 301. In some embodiments, this lumped boost capacitor 308 may include a lumped switch, as described above.

In such an embodiment, a clock signal 392 may travel through-out the drivers 312 and to the lumped boost capacitor 308. The clock signal 392 may result in a word-line clock 322 and may also result in a boost net signal 324. As the word-line clock 322 is generated by the control logic 306 and the boost net signal 324 is generated by the lumped boost capacitor circuit 308, they may not be aligned. As such the timing of the virtual voltage 342 may be negatively affected. Further, as the virtual voltage 342 is generated in a central location and travels throughout the drivers 312, the voltage seen by the nearer versus farther away drivers 312 may differ. In various embodiments, this may not be desirable.

Figure 3B:
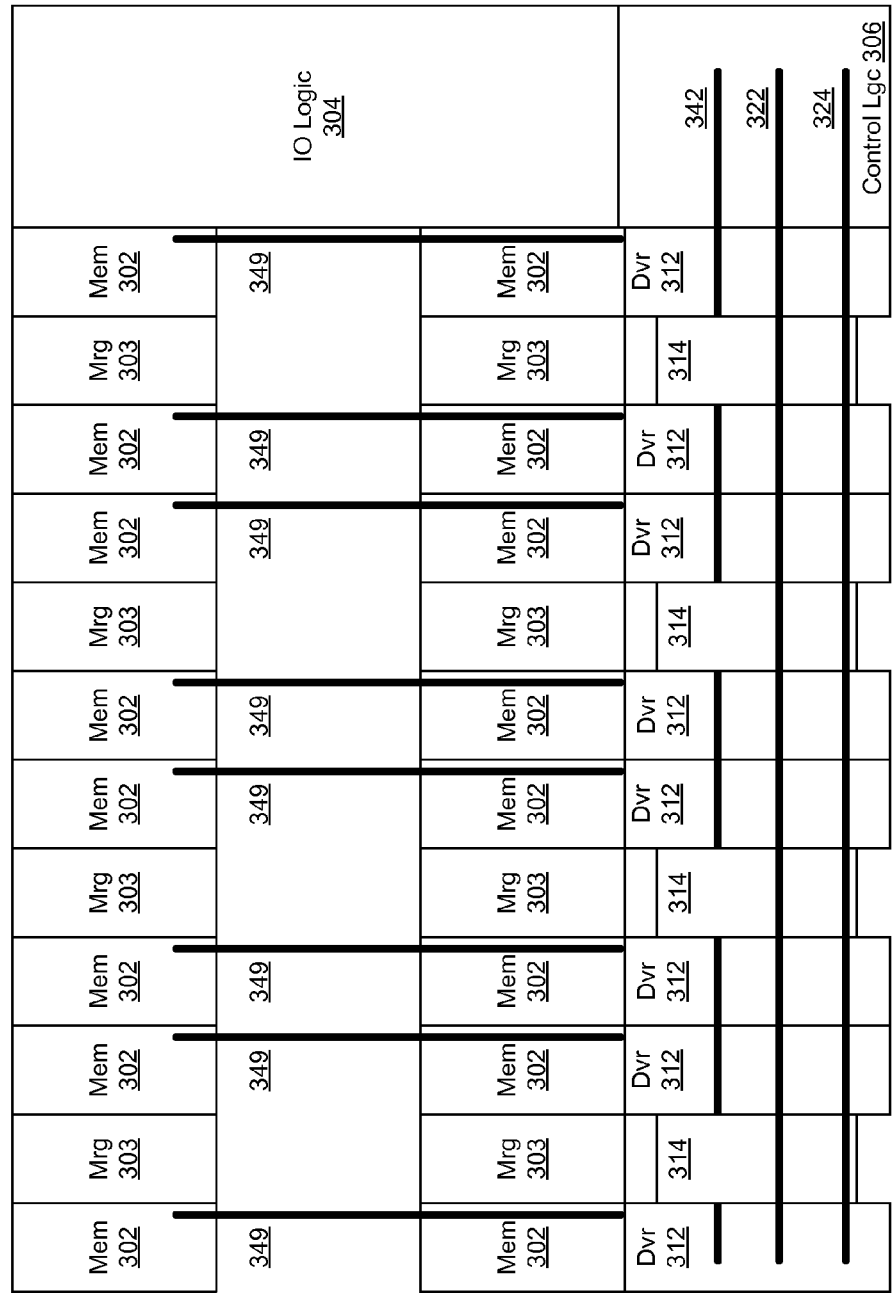
FIG. 3b is a block diagram of an example embodiment of a system in accordance with the disclosed subject matter.

FIG. 3b is a block diagram of an example embodiment of a system 300 in accordance with the disclosed subject matter. In the illustrated embodiment, a distributed boosting element scheme is shown.

In various embodiments, the system 300 may include a memory array that includes a plurality of memory cells 302 arranged in words. In the illustrated embodiment, only a few bits of each word are shown. These words of memory cells 302 may be separated by merge logic 303.

When an input/output (I/O) request (e.g., a read request, write request, etc.) is received by the system 301, the IO logic 304 may detect the appropriate word line for the request. The control logic 306 may then control the signals used to activate the proper word-line driver 312, and word-line signal 349. Via the activation of the appropriate word-line signal 349, the desired or target word of the memory access may be accessed.

In the illustrated embodiment, a plurality of distributed boosting circuits 314. In various embodiments, each distributed boosting circuit 314 may include a distributed boosting element or capacitor and a distributed switch, transistor, or power-gater. In such an embodiment, each distributed boosting element may be co-located with a respective distributed switch. Taken together with a respective driver 312, a distributed boosting circuit 314 may be thought of as a distributed voltage boosted circuit (similar to the voltage boosted circuit 101 of FIG. 1).

In the illustrated embodiment, the word-line clock signal 324 and the boosting net or boosting network control signal 322 may be generated by the control logic 306. In such an embodiment, the word-line clock signal 324 and the boosting net signal 322 may be substantially aligned, as described above.

In the illustrated embodiment, the word-line clock signal 324 and the boosting net signal 322 may be received (in an aligned fashion) by each of the plurality of distributed boosting circuits 314. The distributed boosting circuits 314 may then each generate their respective versions of the virtual voltage 342, as described above. This respective virtual voltage 342 may then be employed by the respective driver 312 to generate the world-line signal 349 at either the first or array voltage, or the second voltage.

In the illustrated embodiment, the plurality of word line drivers 312 may be arranged in blocks of word line drivers. In such an embodiment, each block may include a sub-portion of the plurality of word line drivers 312. Furthermore, the distributed boost network may be arranged in blocks of boost capacitors or boosting circuits 314, wherein each block of boosting circuits 314 is associated with at least one respective block of word line drivers 312 and co-located with the respective block of word line drivers 312.

Figure 4:
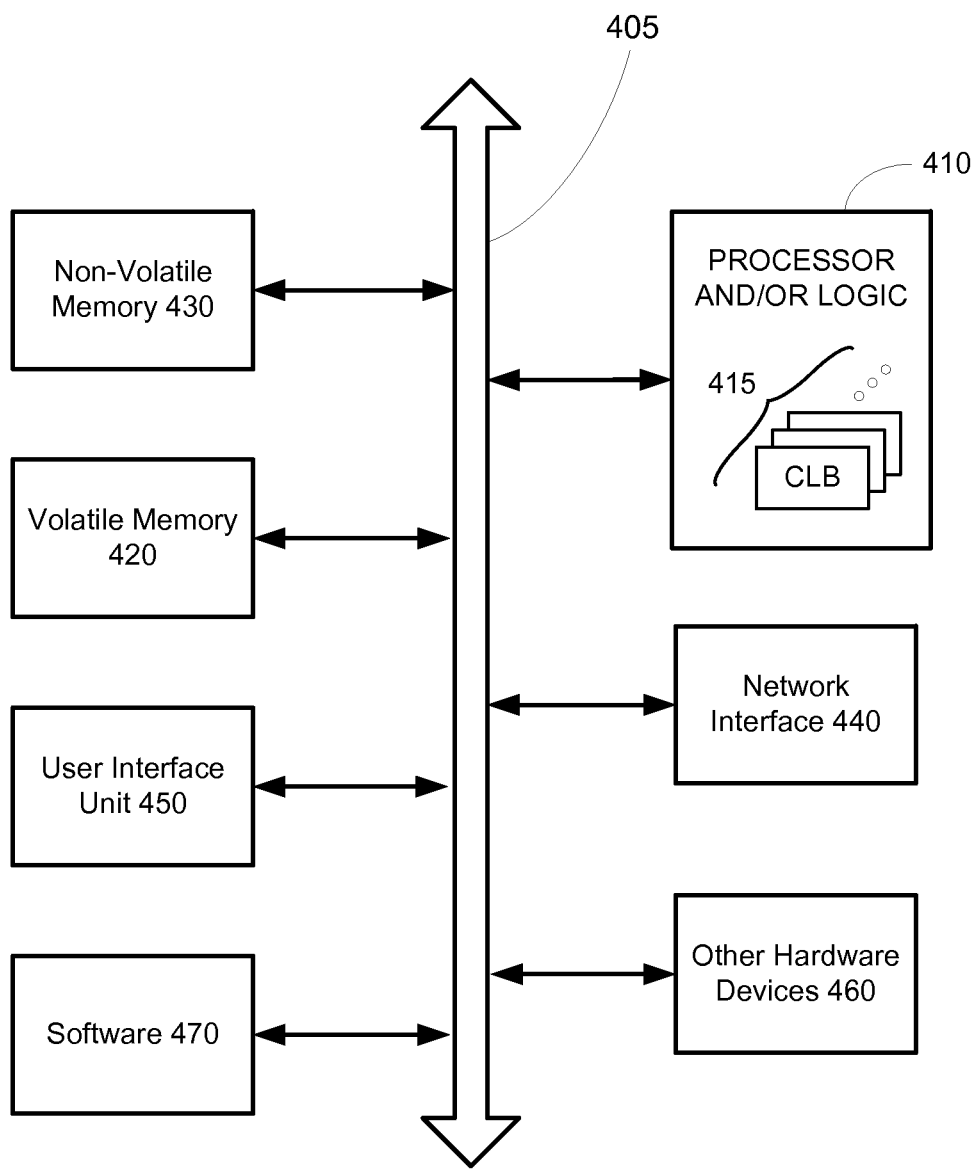
FIG. 4 is a schematic block diagram of an information processing system that may include devices formed according to principles of the disclosed subject matter.

FIG. 4 is a schematic block diagram of an information processing system 400, which may include semiconductor devices formed according to principles of the disclosed subject matter.

Referring to FIG. 4, an information processing system 400 may include one or more of devices constructed according to the principles of the disclosed subject matter. In another embodiment, the information processing system 400 may employ or execute one or more techniques according to the principles of the disclosed subject matter.

In various embodiments, the information processing system 400 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 400 may be used by a user (not shown).

The information processing system 400 according to the disclosed subject matter may further include a central processing unit (CPU), logic, or processor 410. In some embodiments, the processor 410 may include one or more functional unit blocks (FUBs) or combinational logic blocks (CLBs) 415. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 400 according to the disclosed subject matter may further include a volatile memory 420 (e.g., a Random Access Memory (RAM), etc.). The information processing system 400 according to the disclosed subject matter may further include a non-volatile memory 430 (e.g., a hard drive, an optical memory, a NAND or Flash memory, etc.). In some embodiments, either the volatile memory 420, the non-volatile memory 430, or a combination or portions thereof may be referred to as a "storage medium". In various embodiments, the volatile memory 420 and/or the non-volatile memory 430 may be configured to store data in a semi-permanent or substantially permanent form.

In various embodiments, the information processing system 400 may include one or more network interfaces 440 configured to allow the information processing system 400 to be part of and communicate via a communications network. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 400 according to the disclosed subject matter may further include a user interface unit 450 (e.g., a display adapter, a haptic interface, a human interface device, etc.). In various embodiments, this user interface unit 450 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 400 may include one or more other devices or hardware components 460 (e.g., a display or monitor, a keyboard, a mouse, a camera, a fingerprint reader, a video processor, etc.). It is understood that the above are merely a few illustrative examples to which the disclosed subject matter is not limited.

The information processing system 400 according to the disclosed subject matter may further include one or more system buses 405. In such an embodiment, the system bus 405 may be configured to communicatively couple the processor 410, the volatile memory 420, the non-volatile memory 430, the network interface 440, the user interface unit 450, and one or more hardware components 460. Data processed by the processor 410 or data inputted from outside of the non-volatile memory 430 may be stored in either the non-volatile memory 430 or the volatile memory 420.

In various embodiments, the information processing system 400 may include or execute one or more software components 470. In some embodiments, the software components 470 may include an operating system (OS) and/or an application. In some embodiments, the OS may be configured to provide one or more services to an application and manage or act as an intermediary between the application and the various hardware components (e.g., the processor 410, a network interface 440, etc.) of the information processing system 400. In such an embodiment, the information processing system 400 may include one or more native applications, which may be installed locally (e.g., within the non-volatile memory 430, etc.) and configured to be executed directly by the processor 410 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 410.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
a plurality of voltage boosted circuits; and
wherein each voltage boosted circuit comprises:
a power-gater configured to select between an array supply voltage and a second voltage, wherein the second supply voltage is greater than the array supply voltage,
a distributed boost capacitor configured to generate, in part, the second supply voltage, and wherein each distributed boost capacitor is physically located throughout a boosting network, wherein the boosting network comprises a boosting network control signal that is routed substantially with a clock signal, and
a driver configured to generate an electrical signal based upon, as selected by the power-gater, either the array supply voltage or the second supply voltage.

2. The apparatus of claim 1, wherein, for a respective voltage boosting circuit, the boosting network control signal and clock signal are substantially aligned.

3. The apparatus of claim 1, wherein each voltage boosted circuit is integrated with a world-line driver circuit.

4. The apparatus of claim 1, wherein each voltage boosted circuit comprises:
an individual boost decoder circuit configured to cause the respective power-gater to decouple the array supply voltage from the driver.

5. The apparatus of claim 4, wherein the plurality of voltage boosted circuits is configured to enable a first sub-portion of the voltage boosted circuits and disable a second sub-portion of the voltage boosted circuits.

6. The apparatus of claim 5, wherein the power-gaters of the second sub-portion of the voltage boosted circuits are configured to produce substantially no current leakage.

7. The apparatus of claim 1, wherein the plurality of voltage boosted circuits comprise a substantially equal boost duration.

8. The apparatus of claim 1, wherein the power-gater comprises a distributed power-gater that is physically co-located with the distributed boost capacitor.

9. A system comprising:
a plurality of memory cells, each memory cell accessed by a respective word line;
a plurality of word line drivers, each word line driver configured to generate a word line signal at either a first voltage or a second voltage, wherein the second voltage is higher than the first voltage;
a distributed boost network configured to generate, in part, the second voltage from the first voltage, wherein the distributed boost network is physically distributed amongst the plurality of word line drivers;
a clock signal routed to each of a plurality of boost capacitors of the distributed boost network; and
a boosting network control signal routed to each of the boost capacitors.

10. The system of claim 9, wherein the system further comprises a distributed power-gater network configured to select between either the first voltage or the second voltage, and wherein the distributed power-gater network is physically distributed amongst the plurality of word line drivers; and
wherein the distributed boost network comprises a plurality of boost capacitors.

11. The system of claim 9, wherein the clock signal and the boosting network control signal are routed such that, for a respective boost capacitor, the boosting network control signal and clock signal are substantially aligned.

12. The system of claim 9, wherein each word line driver is physically integrated with a respective boost capacitor of the distributed boost network.

13. The system of claim 9, wherein the plurality of word line drivers are arranged in blocks of word line drivers, wherein each block includes a sub-portion of the plurality of word line drivers; and
wherein the distributed boost network is arranged in blocks of boost capacitors, wherein each block of boost capacitors is associated with at least one respective block of word line drivers and co-located with the respective block of word line drivers.

14. The system of claim 9, wherein the distributed boost network comprises a plurality of boosting circuits, wherein the boosting circuits are each associated with a respective word line; and
wherein each boosting circuit comprises:
a power-gater configured to:
in a non-boost mode, supply the first voltage to the respective word line, and
in a boost-mode, shut off and cease to supply the first voltage to the respective word line;
a boost capacitor configured to store excess charge; and
a boost decode circuit configured to switch the power-gater from the non-boost mode and the boost mode; and
wherein, during the boost mode, a voltage supply to respective word line is boosted by capacitive coupling between the boost capacitor and a capacitor coupled with the word line.

15. The system of claim 14, wherein the plurality of boosting circuits are physically distributed through the system such that each boosting circuit is co-located with the associated word line.

16. The system of claim 14, wherein the distributed boost network is configured to enable a first sub-portion of the boosting circuits and disable a second sub-portion of the boosting circuits.

17. The system of claim 16, wherein the power-gaters of the second sub-portion of the boosting circuits are configured to produce substantially no current leakage.

18. An apparatus comprising:
a plurality of memory cells configured to store data;
a plurality of memory cell access drivers, each memory cell access driver configured to generate an access signal at either a first voltage or a second voltage, wherein the second voltage is higher than the first voltage; and
a boosting means for boosting the first voltage to the second voltage, wherein the boosting means is physically distributed amongst the plurality of memory cell access drivers wherein a clock signal and a boosting control signal are routed amongst the boosting means.

19. The apparatus of claim 18, wherein the boosting means comprises a plurality of boosting circuits wherein the boosting circuits are each associated with a respective memory cell access driver; and
wherein each boosting circuit comprises:
a switching means configured to:
in a first mode, supply the first voltage to the respective memory cell access driver, and
in a second mode, cease to supply the first voltage to the respective memory cell access driver;
an additional charge means configured to store excess charge; and
an enabling means configured to control whether the switching means operates in either first mode or the second mode; and
wherein, during the second mode, a voltage supply to respective memory cell access driver is boosted by capacitive coupling between the additional charge means and a capacitor coupled with the word line.

20. The apparatus of claim 18, wherein the boosting means comprises a plurality of boosting sub-means, each boosting sub-means associated with a respective memory cell access driver; and
wherein:
the clock signal is routed to each of the boosting sub-means; and
the boosting control is signal routed to each of the boosting sub-means; and
wherein the clock signal and the boosting control signal are routed such that, for a respective boosting sub-means, the boosting control signal and clock signal are substantially aligned.

* * * * *